(12) United States Patent
Lim

(10) Patent No.: US 12,165,885 B2
(45) Date of Patent: Dec. 10, 2024

(54) CLEANING UNIT AND SUBSTRATE PROCESSING APPARATUS INCLUDING SAME

(71) Applicant: SEMES CO., LTD., Cheonan-si (KR)

(72) Inventor: Sok Taek Lim, Pyeongtaek-si (KR)

(73) Assignee: SEMES CO., LTD., Cheonan-si (KR)

( * ) Notice: Subject to any disclaimer, the term of this patent is extended or adjusted under 35 U.S.C. 154(b) by 253 days.

(21) Appl. No.: 17/531,800

(22) Filed: Nov. 21, 2021

(65) Prior Publication Data

US 2022/0172965 A1 Jun. 2, 2022

(30) Foreign Application Priority Data

Dec. 2, 2020 (KR) .................. 10-2020-0166478

(51) Int. Cl.
*H01L 21/67* (2006.01)
*B08B 5/02* (2006.01)
*B08B 5/04* (2006.01)

(52) U.S. Cl.
CPC .......... *H01L 21/67034* (2013.01); *B08B 5/02* (2013.01); *B08B 5/04* (2013.01); *H01L 21/67144* (2013.01)

(58) Field of Classification Search
CPC H01L 21/67034; H01L 21/67144; B08B 5/02
USPC ........................................................ 34/85
See application file for complete search history.

(56) References Cited

U.S. PATENT DOCUMENTS

| | | | | |
|---|---|---|---|---|
| 4,651,440 A * | 3/1987 | Karl | ................. | F26B 5/08 |
| | | | | 34/239 |
| 5,551,165 A * | 9/1996 | Turner | ............ | H01L 21/67028 |
| | | | | 34/92 |
| 5,974,689 A * | 11/1999 | Ferrell | ............ | B08B 3/12 |
| | | | | 34/340 |
| 6,119,366 A * | 9/2000 | Ferrell | ............ | H01L 21/6704 |
| | | | | 34/340 |
| 7,616,288 B2 * | 11/2009 | Motomatsu | ......... | G02F 1/13392 |
| | | | | 349/126 |
| 8,304,324 B2 * | 11/2012 | Huff | ........ | H01L 24/83 |
| | | | | 438/455 |
| 8,660,157 B2 * | 2/2014 | Huff | ........ | H01S 5/02355 |
| | | | | 438/26 |
| 9,129,998 B2 | 9/2015 | Kim et al. | | |
| 9,355,835 B2 | 5/2016 | Lee | | |
| 9,508,582 B2 * | 11/2016 | Keigler | ............ | H01L 21/67757 |
| 10,546,762 B2 * | 1/2020 | Bergman | ......... | H01L 21/67034 |
| 10,632,506 B2 * | 4/2020 | Tachibana | ............ | H01L 21/027 |
| 11,211,232 B2 * | 12/2021 | Hsieh | ............ | H01L 21/67046 |
| 2004/0123878 A1 | 7/2004 | Cheng et al. | | |
| 2008/0213978 A1 * | 9/2008 | Henry | ............ | B23K 26/40 |
| | | | | 257/E21.238 |

(Continued)

FOREIGN PATENT DOCUMENTS

| | | |
|---|---|---|
| CN | 103531503 | 1/2014 |
| CN | 205289123 | 6/2016 |

(Continued)

*Primary Examiner* — Stephen M Gravini

(57) ABSTRACT

A cleaning unit includes a gas spray part arranged above a substrate to be cleaned, and sprays a gas toward the substrate in order to separate a contaminant on the substrate from the substrate, and a suction part provided on a side of the gas spray part, and including an inlet suctioning and removing the contaminant that is separated from the substrate.

20 Claims, 11 Drawing Sheets

(56) References Cited

U.S. PATENT DOCUMENTS

2012/0079672 A1  4/2012  Cho et al.
2022/0172965 A1* 6/2022  Lim .................. H01L 21/67028

FOREIGN PATENT DOCUMENTS

| CN | 207124808 | | 3/2018 | |
|---|---|---|---|---|
| CN | 114571140 A | * | 6/2022 | ............... B08B 5/02 |
| JP | 60164329 A | * | 8/1985 | ....... H01L 21/67034 |
| KR | 10-2012-0035033 | | 4/2012 | |
| KR | 101866201 | | 10/2012 | |
| KR | 10-2017-0061300 | | 6/2017 | |
| KR | 10-2019-0009508 | | 1/2019 | |
| KR | 20220077970 A | * | 10/2022 | |
| TW | 202025383 A | * | 7/2020 | ............. B08B 1/006 |
| TW | 202223982 A | * | 6/2022 | ............... B08B 5/02 |
| WO | WO-2016088731 A1 | * | 6/2016 | ................ B01F 1/00 |

\* cited by examiner

CLEANING UNIT AND SUBSTRATE PROCESSING APPARATUS INCLUDING SAME

CROSS REFERENCE TO RELATED APPLICATION

The present application claims priority to Korean Patent Application No. 10-2020-0166478, filed Dec. 2, 2020, the entire contents of which is incorporated herein for all purposes by this reference.

BACKGROUND OF THE INVENTION

Field of the Invention

The present disclosure relates to a cleaning unit and a substrate processing apparatus including the same, the cleaning unit being configured to clean a substrate or a substrate support member on which the substrate is loaded.

Description of the Related Art

In general, semiconductor devices are formed on a silicon wafer used as a semiconductor substrate while a series of manufacturing processes are repeatedly performed. The wafer on which the semiconductor devices are formed may be divided into a plurality of dies through a dicing process. The dies individualized through the dicing process may be bonded on a substrate such as a lead frame through a die bonding process.

When a die is bonded on a substrate, as particles are attached to a surface of the substrate, quality defects such as lowering of adhesion may occur. Therefore, it is important to remove particles in the bonding process. Particles with a size of 5 to 10 μm may also cause voids in an adhesive.

Therefore, in the die bonding process, cleaning is generally performed by blowing air (hereinbelow, which will be referred as 'the air blow') to remove the particles on the substrate (hereinafter, particles on substrate are referred to as contaminants). The air blow may remove the contaminant from the substrate by spraying cleaning gas such as air or inert gas before the die is bonded on the substrate. The air blow may be arranged at an upper side of the substrate. The air blow may include a gas nozzle for spraying the cleaning gas toward the substrate and an inlet for suctioning the contaminants separated from the substrate by the gas nozzle.

However, the conventional air blow is provided such that both the gas nozzle and the inlet are provided on a surface facing the substrate, so that by the cleaning gas may prevent the contaminants separated from the substrate or the die from being suctioning into the inlet and from easily flying. After the cleaning process, the contaminants that are not suctioned into the inlet may fly and settle again on the substrate or members constituting a die bonding device. Therefore, cleaning efficiency may be reduced. Likewise, when a substrate support member on which the substrate is loaded is not precisely managed, the contaminants existing on the substrate support member are settled on the members constituting the substrate or the die bonding device, so that the cleaning efficiency may be reduced.

The general air blow is provided while being fixed to the upper portion of the substrate, and thus are insufficient for efficient contaminant removal across the entire width of the substrate and for prevention of re-attachment of the removed contaminants.

Documents of Related Art (Patent Document 1) Korean Patent No. 10-1866201 (2018.06.04)

SUMMARY OF THE INVENTION

Accordingly, the present disclosure has been made keeping in mind the above problems occurring in the related art, and the present disclosure is intended to provide a cleaning unit and a substrate processing apparatus including the same, the cleaning unit being capable of cleaning the entire surface of a substrate regardless of the size of the substrate.

Another objective of the present disclosure is intended to provide a cleaning unit and a substrate processing apparatus including the same, the cleaning unit having improved cleaning efficiency.

A further objective of the present disclosure is intended to provide a cleaning unit and a substrate processing apparatus including the same, the cleaning unit being capable of maximizing cleaning efficiency with a minimum flow rate of gas.

A further objective of the present disclosure is intended to provide a cleaning unit and a substrate processing apparatus including the same, the cleaning unit being capable of preventing contamination of a substrate by preventing contamination of a substrate support member supporting the substrate.

The problem to be solved is not limited thereto, and other problems not mentioned will be clearly understood by those skilled in the art from the following description.

In order to achieve the above objective, according to one aspect of the present disclosure, there is provided a cleaning unit including: a gas spray part arranged on an upper surface of a substrate to be cleaned, and configured to spray gas toward the substrate in order to separate a contaminant on the substrate from the substrate; and a suction part provided on a side of the gas spray part, and including an inlet configured to suction and remove the contaminant that is separated from the substrate.

The gas spray part may be inclined at a predetermined angle with respect to the upper surface of the substrate to spray the gas in an oblique direction toward the upper surface of the substrate.

The predetermined angle may be an acute angle that is equal to or less than 80°.

The gas spray part may include a slit type nozzle.

A slit spacing of the slit type nozzle may be equal to or less than 0.3 mm.

The suction part may be arranged to face the upper surface of the substrate to suck the contaminant in a perpendicularly upward direction, and the inlet may be provided on a surface of the suction part facing the substrate.

The suction part may include a housing with an open lower surface, and the inlet may be provided on an upper surface of the housing.

The suction part may have one lateral wall formed in parallel to the gas spray part.

The suction part may be attached to the gas spray part and be provided integrally with the suction part.

A middle member may be provided between the suction part and the gas spray part.

The cleaning unit may include a vertical drive part configured to vertically move the gas spray part and the suction part.

The gas spray part and the suction part may be physically separated from each other.

The cleaning unit may include a horizontal drive part configured to horizontally move the gas spray part and the suction part.

A bonding module may include: a substrate support member configured to support a substrate; a bonding unit including at least one bonding head for bonding a die to the substrate; and a cleaning unit provided on an upper surface of the substrate support member and configured to clean the substrate support member, wherein the cleaning unit may include: a gas spray part configured to spray gas toward the substrate support member in order to separate a contaminant on the substrate support member from the substrate support member; and a suction part including an inlet provided on a side of the gas spray part and configured to suction and remove the separated contaminant, and a discharge duct communicating with the inlet to discharge the contaminant.

The gas spray part may be inclined downward at an acute angle that may be equal to or less than 80° with respect to a moving direction of the substrate support member, and the gas spray part obliquely sprays the gas toward the substrate support member.

The gas spray part may include a slit type nozzle, and a slit spacing of the slit type nozzle may be equal to or less than 0.3 mm.

The suction part may be arranged to face a transfer rail to suck the contaminant in a perpendicular upward direction of the substrate support member, the suction part including a housing with an open lower surface, and the inlet may be provided at an upper surface of the housing.

The suction part may have one lateral wall formed in parallel to the gas spray part, and the one lateral wall may be attached to the gas spray part.

The bonding module may be a drive part configured to horizontally and vertically move the cleaning unit.

A bonding equipment may include: a load port configured to a container accommodating a substrate; a substrate transfer module configured to transfer the substrate from the container loaded on the load port; a bonding module configured to bond a die to the substrate provided from the substrate transfer module; and an inspection module configured to receive the substrate processed by the bonding module from the substrate transfer module and to inspect the die bonded on the processed substrate, wherein the bonding module may include: a substrate support member configured to support the substrate; a transfer rail configured to move the substrate support member; a first drive part configured to transfer the substrate support member along the transfer rail; at least one bonding head configured to bond the die to the substrate; a head drive part configured to horizontally and vertically transfer the bonding head; and a cleaning unit provided at an upper portion of the transfer rail and configured to clean the substrate support member.

According to the embodiment of the present disclosure, the cleaning unit includes the gas spray part, which is obliquely formed to have a predetermined angle with respect to the upper surface of the substrate at one wall of the suction part, to obliquely spray gas toward the upper surface of the substrate. Therefore, the contaminant securely attached to the substrate can be easily removed from the substrate. The cleaning unit with improved cleaning efficiency and the substrate processing apparatus including the same can be provided.

The gas spray part includes the slit type nozzle so as to uniformly clean the entire substrate. Therefore, even when a minimum flow rate of gas is supplied, the cleaning process with improved cleaning performance can be performed.

According to the embodiment of the present disclosure, as the substrate support member on which the substrate is loaded is cleaned, contamination of the substrate support member can be prevented and the bonding performance can be stabilized.

The effect of the present disclosure is not limited to the above description, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
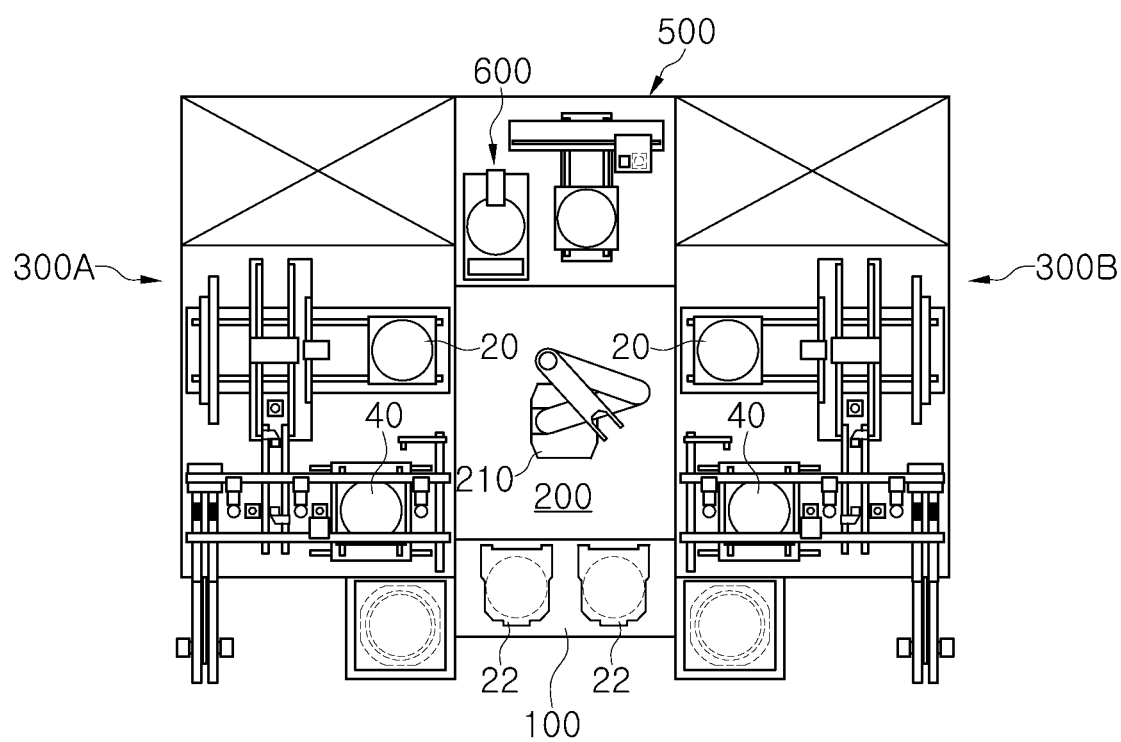
FIG. 1 is a plan view schematically showing a substrate processing apparatus according to an embodiment of the present disclosure.
Figure 1:
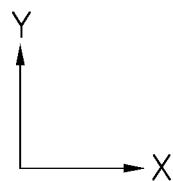

Hereinbelow, exemplary embodiments of the present disclosure will be described in detail with reference to the accompanying drawings such that the present disclosure can be easily embodied by one of ordinary skill in the art to which the present disclosure belongs. However, the present disclosure may be changed to various embodiments and the scope and spirit of the present disclosure are not limited to the embodiments described hereinbelow.

In the following description, if it is decided that the detailed description of a known function or configuration related to the present disclosure makes the subject matter of the present disclosure unclear, the detailed description is omitted, and the same reference numerals will be used throughout the drawings to refer to the elements or parts with same or similar function or operation.

Further, technical terms, as will be mentioned hereinafter, are terms defined in consideration of their function in the present disclosure, which may be changed according to the intention of a user, practice, or the like. Therefore, the terms should be defined based on the contents of this specification.

Unless the context clearly indicates otherwise, it will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion such as "between" versus "directly between", "adjacent" versus "directly adjacent", etc.

In the drawings, the shapes and sizes of parts and thicknesses of lines may be exaggerated for convenience of understanding.

Embodiments of the present disclosure will be described with reference to schematic figures in exemplary embodiments of the present disclosure. Accordingly, changes from the figures in the drawings, for example, changes in manufacturing methods and tolerances, are sufficiently predictable. Therefore, the embodiments of the present disclosure are not described as being limited to the specific figures of areas as shown in the drawings, but rather to include deviations in the figures. The elements shown in the drawings are entirely schematic and the figures thereof in the drawings are not intended to describe the exact figures thereof, and are not intended to limit the scope of the present disclosure.

FIG. 1 shows a schematic structure of a substrate processing apparatus according to an embodiment of the present disclosure.

Referring to FIG. 1, the substrate processing apparatus according to the embodiment of the present disclosure includes bonding equipment 10. The bonding equipment 10 may be used to perform a die bonding process of bonding dies on the substrate. For example, the bonding equipment 10 may be used to bond the dies on the substrate such as a circuit board substrate, a lead frame, etc. in the die bonding process for manufacturing a semiconductor device. The bonding equipment 10 may be used to directly bond the dies on a semiconductor wafer for manufacturing a multi-chip package.

The bonding equipment 10 may include a load port 100, a substrate transfer module 200, a plurality of bonding modules 300A and 300B, and an inspection module 500. The load port 100 is configured such that a container 22 accommodating a plurality of substrates 20 is loaded thereon. The substrate transfer module 200 transfers the substrates 20 from the container loaded on the load port 100. The plurality of bonding modules 300A and 300B bonds the dies on the substrates 20 provided from the substrate transfer module 200. The inspection module 500 receives the substrates 20 that have been under the bonding processing by the bonding modules 300A, 300B from the substrate transfer module 200 and inspects the dies bonded on the substrates 20.

The bonding equipment 10 may include the plurality of bonding module for improving the productivity. As an example, the bonding equipment 10 may include a first bonding module 300A and the second bonding module 300B that have the same structure. As shown in FIG. 1, the first bonding module 300A and the second bonding module 300B may be spaced apart from the substrate transfer module 200 at a predetermined distance and be symmetrically arranged with the substrate transfer module 200 as the center. The number and arrangement of the bonding modules may be changed, whereby the scope of the present disclosure may not be limited.

The substrate transfer module 200 may include a transfer robot 210. The transfer robot 210 may include a hand unit 212 for transferring the substrate. The substrate transfer module 200 may take the substrates 20 out of the container 22 and load the substrates 20 on the bonding modules 300A and 300B. Then, when the bonding process for the substrates 20 is complete, the substrate 20 that has been bonded may be unloaded from the bonding module 300A, 300B. The substrate transfer module 200 may be used to load and unload the substrate 20 with respect to the bonding module 300A, 300B.

Figure 2:
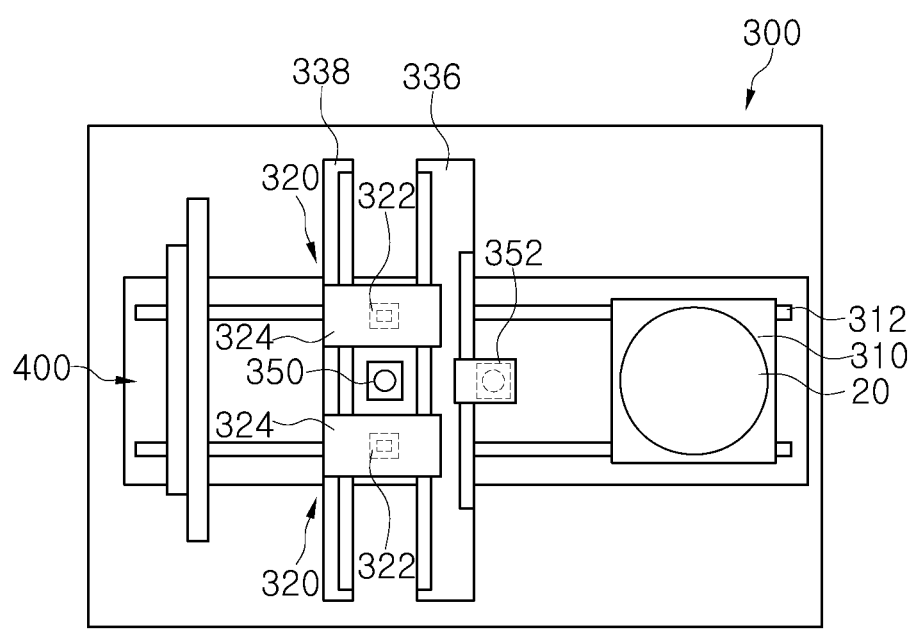
FIG. 2 is an enlarged block diagram schematically showing a structure of a bonding module shown in FIG. 1.
Figure 3:
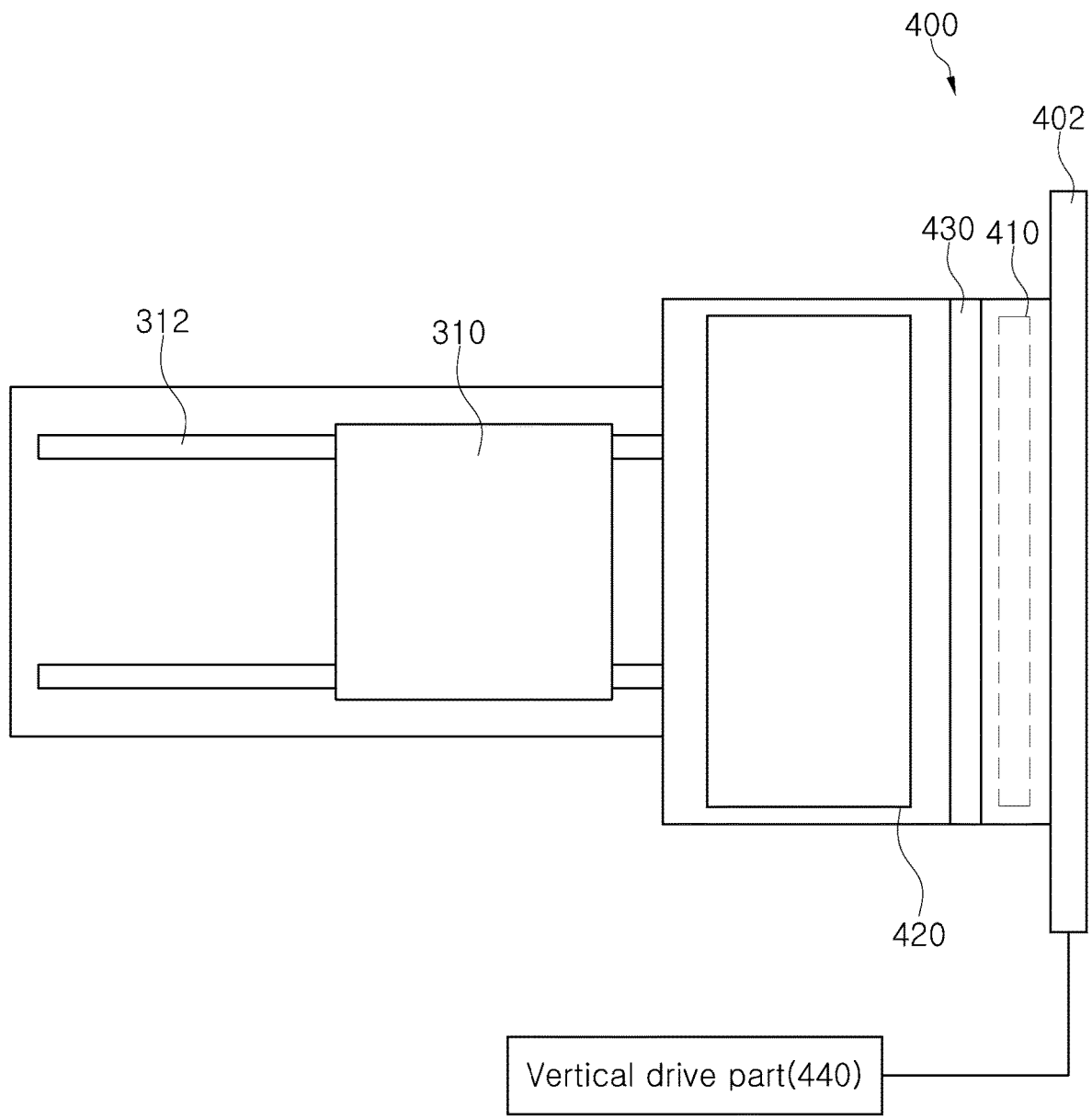
FIG. 3 is an enlarged plan view schematically showing a cleaning unit according to an embodiment of the present disclosure.

The first bonding module 300A and the second bonding module 300B may have the same structure. FIG. 2 is an enlarged block diagram schematically showing the bonding module 300A, 300B shown in FIG. 1. FIG. 3 is an enlarged block diagram schematically showing the cleaning unit shown in FIG. 2.

Referring to FIGS. 2 and 3, the bonding module 300A may include a substrate support member 310 supporting the substrate 20, a bonding unit 320 including at least one bonding head 322 for bonding dies on the substrate 20, and a cleaning unit 400 cleaning the substrate support member 310. Although not shown in the drawings, the substrate processing apparatus may include a controller controlling the driving (horizontal movement and vertical movement) of the bonding unit 320.

The substrate support member 310 may include a bonding stage on which the substrate is loaded. Rails 312 may be provided below the substrate support member 310 to provide a moving route of the substrate support member 310. The substrate support member 310 may be moved along the rails 312 by a first drive part (not shown) separately provided. Although not shown in the drawings, the substrate support member 310 may include a heater therein to heat the substrate 20. The substrate support member 310 may include vacuum holes to hold the substrate 20.

The bonding unit 320 may include the bonding head 322 for bonding the die on the substrate 20 and a head drive part 324 for horizontally and vertically moving the bonding head 322.

A bonding tool having a size corresponding to a die may be removably mounted to the bonding head 322. The bonding head 322 may pick the die up using vacuum pressure. The bonding head 322 may have a heater (not shown) for heating the die. The bonding head 322 may be horizontally moved along a gantry structure 336, 338 including first and second gantries that extend in a Y-axis direction in parallel to each other. The gantry structure 336, 338 may be provided at an upper portion of the rails 312. The bonding head 322 may be configured to be vertically movable for performing the bonding process.

The head drive part 324 may be arranged on the gantry structure 336, 338, and may include a movable plate member allowing the bonding head 322 to be moved in the Y-axis direction on the gantry structure 336, 338. The head drive part 324 may include a vertical drive part (not shown) for vertically moving the bonding head 322. The vertical drive part (not shown) may be mounted to the movable plate member.

The substrate support member 310 may be moved in an X-axis direction by the first drive part. The bonding head 322 may be moved in the Y-axis direction by the head drive part. Arrangement between a bonding location on the substrate 20 and the bonding head 322 may be performed by the first drive part and the head drive part 324. The substrate support member 310 may be configured to be rotatable for arrangement of the substrate 20.

Meanwhile, the bonding module 300 may include an under camera 350 at a lower portion of the bonding head 322 in order to check whether the bonding tool is normally mounted. Specifically, the bonding tool may be replaced in response to the size of the die on the substrate 20, and after the bonding tool is mounted, a mounting condition of the bonding tool may be inspected by the under camera 350.

An upper arrangement camera 352 may be arranged at an upper portion of the substrate support member 310 in order to detect a bonding location on the substrate 20. As an embodiment, the upper arrangement camera 352 may be configured to be movable in the Y-axis direction by a camera drive part 364 on the first gantry structure 336, and may be used for the bonding location and the arrangement of the bonding head 322. The bonding location on the substrate 20 may be detected by the upper arrangement camera 352, and a location of the bonding head 322 may be adjusted by the bonding head 322.

Figure 4:
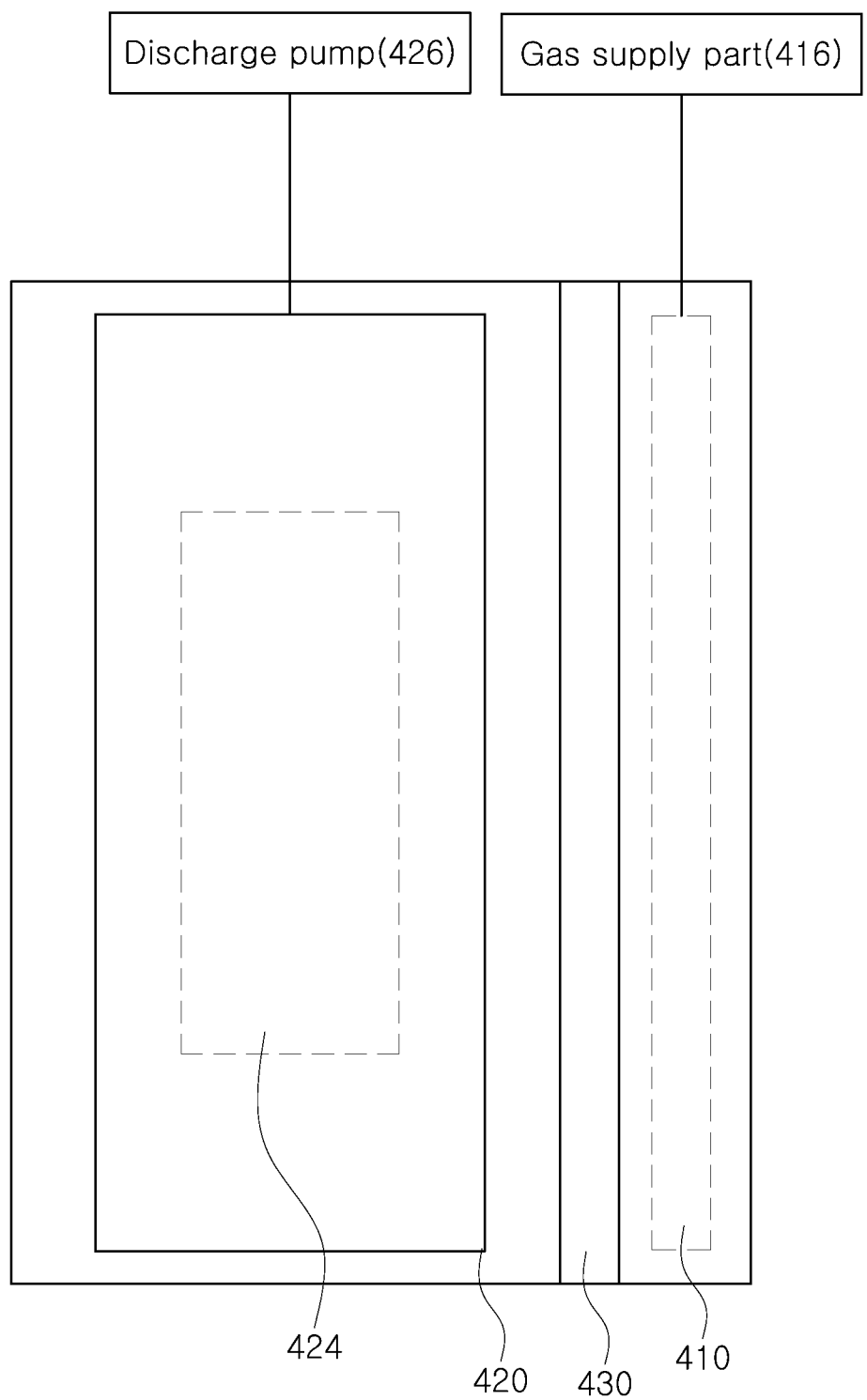
FIG. 4 is an enlarged block diagram schematically showing the cleaning unit according to an embodiment of the present disclosure.
Figure 5:
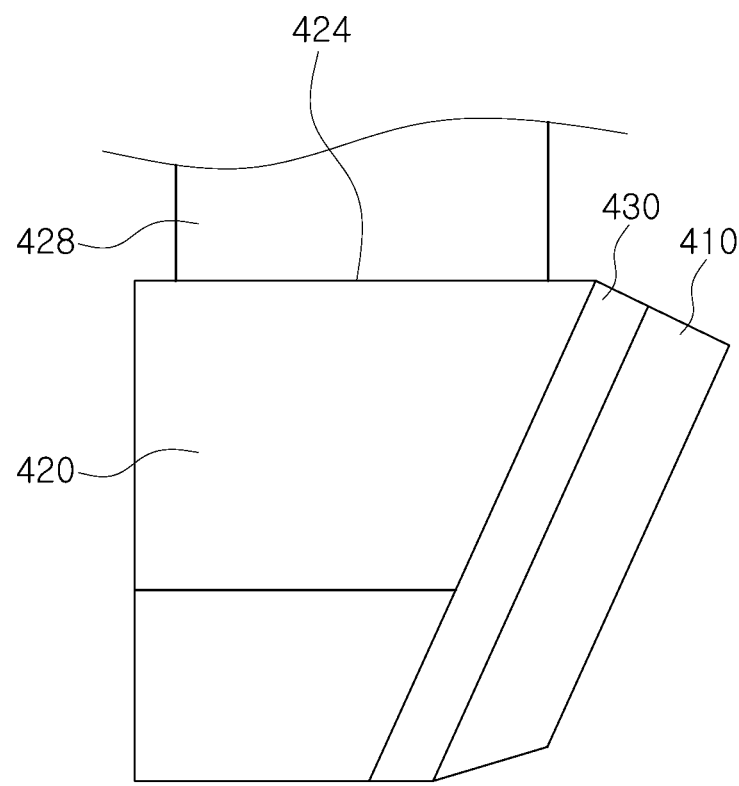
FIG. 5 is a side view showing the cleaning unit according to an embodiment of the present disclosure.
Figure 5:
Figure 6:
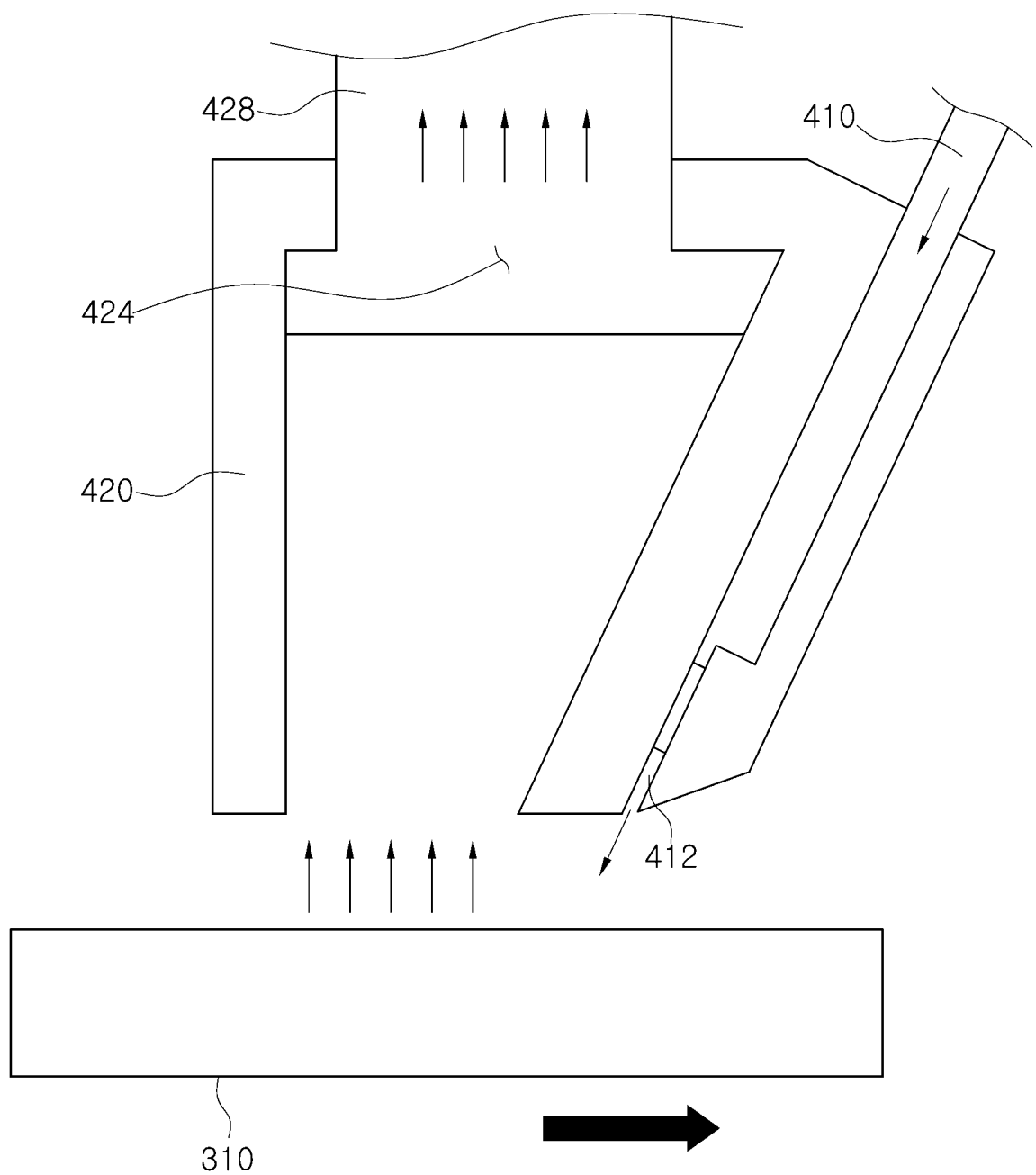
FIG. 6 is a side sectional view the cleaning unit according to an embodiment of the present disclosure shown in FIG. 5.

FIGS. 3 to 6 are views showing the cleaning unit 400 shown in FIG. 2. FIG. 3 is a plan view schematically showing the cleaning unit 400 shown in FIG. 2. FIG. 4 is a block diagram schematically showing a structure of the cleaning unit 400. FIG. 5 is a side view showing the cleaning unit 400. FIG. 6 is a side sectional view showing the cleaning unit 400.

The cleaning unit 400 may include a gas spray part 410 and a suction part 420. The gas spray part 410 is provided at an upper portion of the substrate to be cleaned and sprays gas toward the substrate so as to separate a contaminant on the substrate from the substrate. The suction part 420 is vacuum-suctions and remove the contaminant that has been separated from the substrate. According to the embodiment of the present disclosure, the cleaning unit 400 may be supported by a third gantry structure 402 provided on the bonding module 300. In the specification, the third gantry structure 402 is located at a left end of the bonding module 300, as an example. However, the location of the third gantry structure 402 may be any location to the left of the locations of the first and second gantry structures 336 and 338 and any position in which the substrate support member 310 may pass through the cleaning unit 400 before receiving the substrate 20.

The gas spray part 410 may be supported by the third gantry structure 402 and be arranged at the upper portion of the substrate support member 310 to be cleaned, and may be provided at a predetermined angle with respect to a movement direction of the substrate support member 310. Preferably, the predetermined angle is an acute angle equal to or less than 80°. Specifically, it is preferable that the predetermined angle is an acute angle equal to or higher than 30° and equal to or less than 80°. The gas sprayed from the gas spray part 410 is not vertically sprayed toward an upper surface of the substrate support member 310, but rather obliquely sprayed, by the gas spray part 410 obliquely provided at the predetermined angle. The contaminant on the substrate 20 may be blown by the sprayed gas. The contaminant may be suctioned and removed by the suction part 420, which will be described later.

The gas spray part 410 is connected to a gas supply part 416 so as to be supplied with the gas, and air or inert gas may be used as the gas from the gas supply part 416. Although not shown in the drawings, the gas spray part 410 may be coupled to an ionizer. The ionizer ionizes the gas. The gas spray part 410 may spray the gas ionized by the ionizer to the substrate 20.

The gas spray part 410 may include a nozzle 414 for spraying the gas toward the substrate support member 310. The nozzle 414 may be provided in a slit type nozzle in order to spray a uniform amount of the gas to the entire area of the substrate support member 310. It is preferable that a slit spacing of the slit type nozzle does not exceed 0.3 mm. When the slit spacing is maintained equal to or less than 0.3 mm, the amount of the gas sprayed from the gas spray part 410 may be minimized.

The suction part 420 may be arranged to face the substrate support member 310 so that the contaminant is suctioned upward from the substrate support member 310. The suction part 420 may include an inlet 424 on a surface facing the substrate support member 310 in order to suction the contaminant. As an example, the suction part 420 may include a housing 422 provided at a direct upper portion of the substrate support member 310 and formed in a box shape with an open lower surface. The inlet 424 may be formed on an upper surface of the housing 422. The upper surface of the housing 422 may be coupled to a discharge duct 428 connected to a discharge pump 426. The discharge duct 428 may communicate with the inlet 424. The suction part 420 may be formed in a shape inclined in a direction opposite to the inclined direction of the gas spray part 410.

The length of the suction part 420 may be formed to be equal to or longer than the length of the substrate support member 310. The substrate support member 310 passes through a lower portion of the cleaning unit 400. Therefore, even when the width of the suction part 420 is less than the width of the substrate support member 310, the entire upper surface of the substrate support member 310 may be scanned by the suction part 420 when the substrate support member 310 is moved along the rails 312.

One lateral wall of the suction part 420 may be formed in parallel to the gas spray part 410 so as to be coupled to the gas spray part 410. The suction part 420 may be formed such that a side section thereof is formed in a right-angled trapezoid. The suction part 420 may be formed such that the one lateral wall thereof to be coupled to the gas spray part 410 is inclined at an angle formed by the gas spray part 410 and the substrate support member 310. Therefore, the gas spray part 410 may be attached to the inclined lateral wall of the suction part 420, and the cleaning unit 400 may be provided in an integrated type in which the suction part 420 and the gas spray part 410 are coupled to each other. In order to separate an entrance of the suction part 420 and an entrance of the gas spray part 410, a middle member 430 may be provided between the suction part 420 and the gas spray part 410.

Referring to FIG. 6, the cleaning unit 400 according to the embodiment of the present disclosure includes the gas spray part 410 and the suction part 420. The gas spray part 410 may be provided to clean the upper surface of the substrate support member 310. The gas spray part 410 is inclined at an acute angle equal to or less than 80° with respect to the movement direction of the substrate support member 310. The suction part 420 has the box-shaped housing 422 in which one lateral wall is formed in parallel to the gas spray part 410 and the lower surface is open while being attached to the gas spray part 410. Therefore, the gas spray part 410 obliquely sprays the gas toward the substrate support member 310 moved along the rails 312. The contaminant blown from the substrate support member 310 by the obliquely sprayed gas is suctioned into the suction part 420, so that the contaminant on the substrate support member 310 may be removed.

The gas spray part 410 includes the slit type nozzle and uniformly sprays the gas on the entire upper surface of the substrate support member 310. The length of the suction part 420 is equal to or longer than the width of the substrate support member 310. Therefore, the contaminant may be efficiently separated from the substrate support member 310, and the contaminant separated from the substrate support member 310 may be prevented from being re-attached to the substrate support member 310 or scattering out of the suction part 420. Furthermore, the slit type nozzle with a slit spacing of 0.3 mm or less is provided to maximize cleaning performance by a minimum flow rate. The cleaning unit 400 may include a vertical drive part 440 for vertically moving the gas spray part 410 and the suction part 420. As the gas spray part 410 and the suction part 420 are vertically moved by the vertical drive part 440, the gas spray part 410 and the suction part 420 may be arranged close to the substrate support member 310 and clean the substrate support member 310.

When the cleaning unit 400 cleans the substrate support member 310, the vertical drive part 440 moves the gas spray part 410 and the suction part 420 downward, so that the gas spray part 410 and the suction part 420 may be arranged as close to the upper surface of the substrate support member 310 as possible. Therefore, the gas sprayed from the gas spray part 410 may reach the upper surface of the substrate support member 310 as much as possible, and scattering of the contaminant may be prevented out of the suction part 420. It is preferable to completely touch the gas spray part 410, the suction part 420, and the substrate support member 310. Therefore, the cleaning performance may be further improved when the gas spray part 410 and the suction part 420 are provided to be vertically movable than when the gas spray part 410 and the suction part 420 are securely provided at the upper portions of the rails 312.

Figure 7:
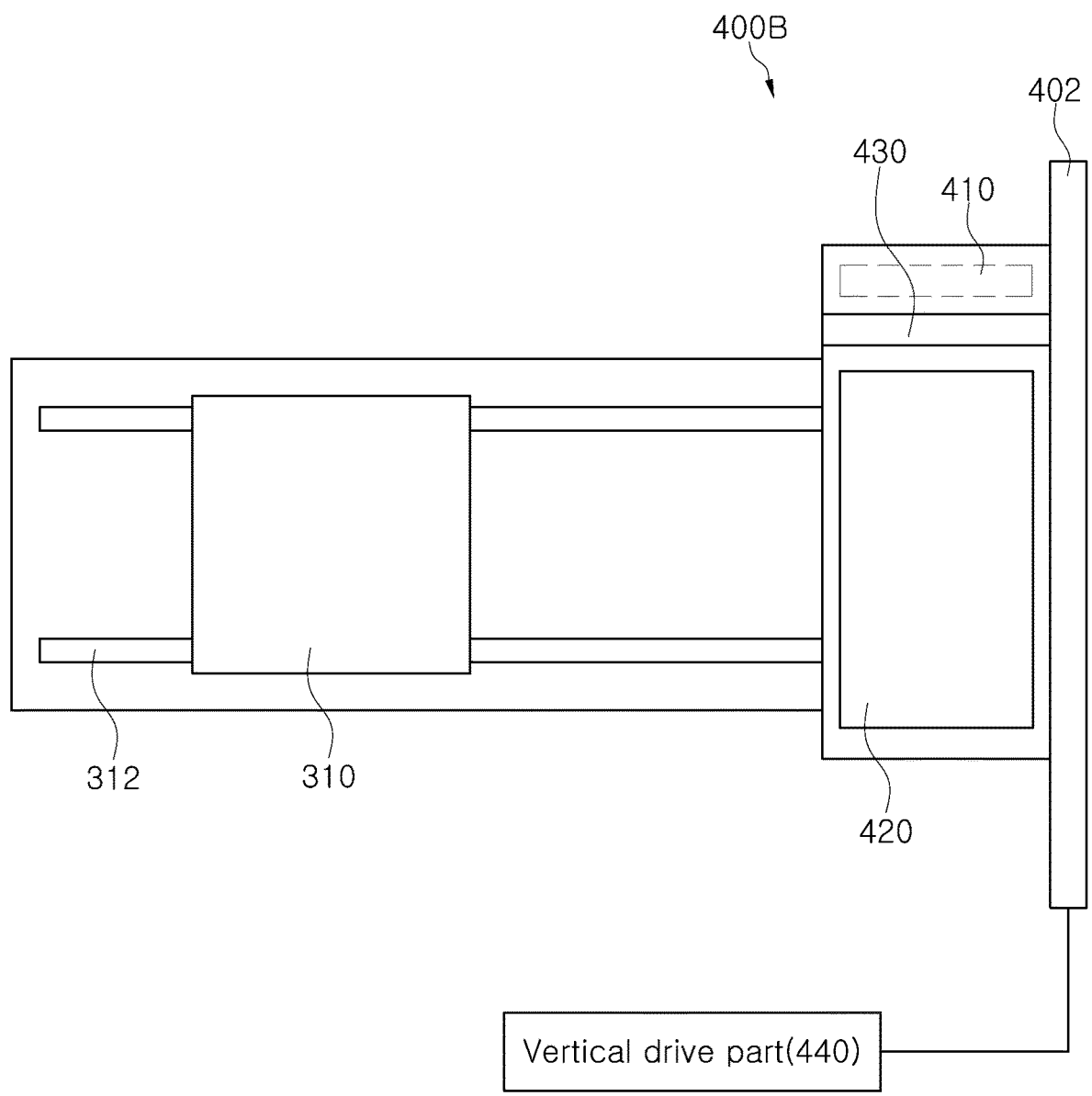
FIG. 7 is an enlarged plan view schematically showing a cleaning unit according to an embodiment of the present disclosure.

FIG. 7 is a top view showing a cleaning unit 400B according to an embodiment of the present disclosure. The cleaning unit 400B according to the present disclosure has the same structure as the cleaning unit 400A as shown in FIG. 3 except for a direction of the gas spray part 410. Therefore, reference numerals are used for the same components and detailed descriptions thereof are omitted.

The gas spray part 410 of the cleaning unit 400B may be arranged at a predetermined angle with respect to a direction perpendicular to a movement direction of the substrate support member 310. The gas spray part 410 may be arranged to spray the gas in the direction perpendicular to the movement direction of the substrate support member 310. Therefore, the gas spray part 410 and the suction part 420 may be supported by the third gantry structure 402. The suction part 420 may be formed such that the length thereof is equal to or longer than the length of the substrate support member 310 as in the embodiment. The substrate support member 310 passes through a lower portion of the cleaning unit 400B. Therefore, even when the length of the suction part 420 is less than the width of the substrate support member 310, the entire upper surface of the substrate support member 310 may be scanned by the suction part 420 when the substrate support member 310 is moved along the rails 312.

Figure 8:
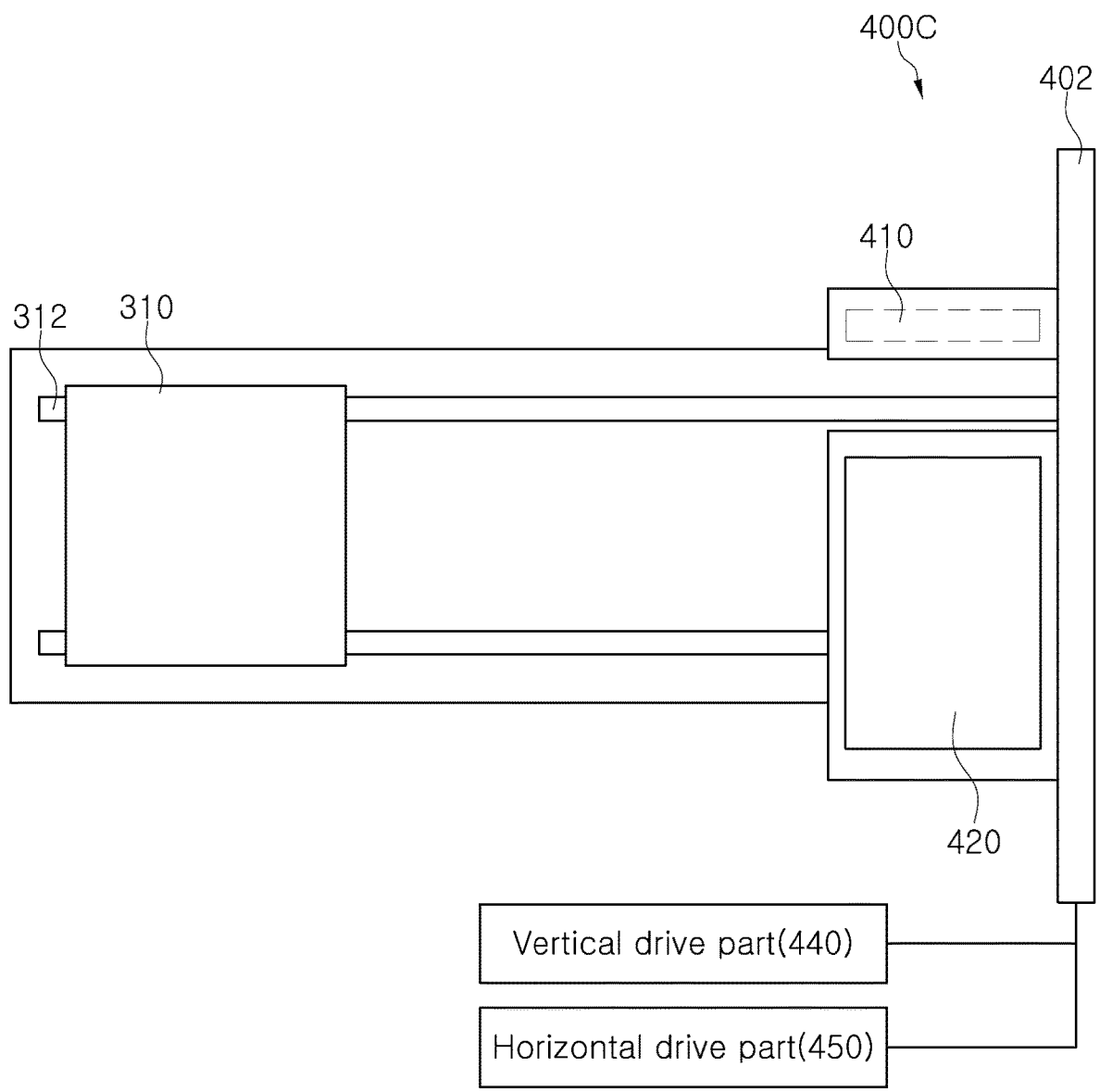
FIG. 8 is an enlarged plan view schematically showing a cleaning unit according to an embodiment of the present disclosure.

FIG. 8 is a top view showing a cleaning unit 400C according to an embodiment of the present disclosure. The cleaning unit 400C according to the embodiment of the present disclosure has the same structure as the cleaning unit 400B as shown in FIG. 7 except that the gas spray part 410 and the suction part 420 are separated from each other. Therefore, reference numerals are used for the same components and detailed descriptions thereof are omitted.

The gas spray part 410 and the suction part 420 of the cleaning unit 400C are not integrally provided, and may be separately provided. The cleaning unit 400C may include a horizontal drive part 450 provided for horizontally moving the gas spray part 410 and the suction part 420 along the third gantry structure 402. Alternately, the location of the suction part 420 may be fixed on the upper surface of the substrate support member 310, and only the gas spray part 410 may be movable by a horizontal drive part 450.

Figure 9:
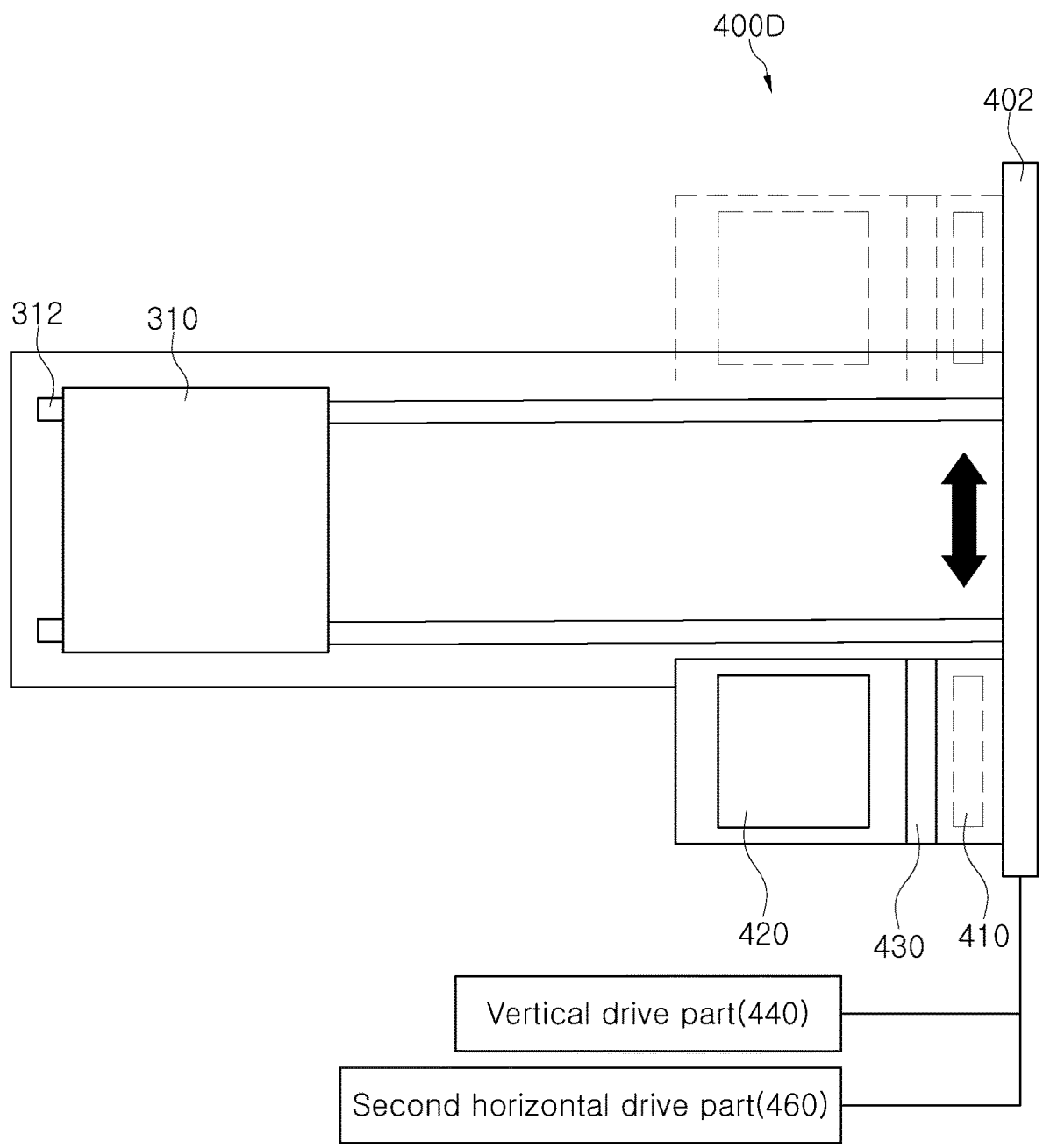
FIG. 9 is an enlarged plan view schematically showing a cleaning unit according to an embodiment of the present disclosure.

FIG. 9 is a top view showing a cleaning unit 400D according to an embodiment of the present disclosure. The cleaning unit 400D according to the embodiment of the present disclosure has the same structure as the cleaning unit 400 as shown in FIG. 3 except that lengths of the gas spray part 410, the suction part 420, and the middle member 430 are shortened. Therefore, reference numerals are used for the same components and detailed descriptions thereof are omitted.

The cleaning unit 400D may be configured such that the length of the gas spray part 410 and the suction part 420 integrated with each other is shorter than the length of the substrate support member 310. The cleaning unit 400D may include a second horizontal drive part 460 provided for horizontally moving the gas spray part 410 and the suction part 420, which are integrally provided, along the third gantry structure 402. Therefore, the cleaning unit 400D may be configured to scan the entire upper surface of the substrate support member 310 by being horizontally moved on the upper portion of the substrate support member 310 by the second horizontal drive part 460, even when the length of the gas spray part 410 and the suction part 420 are shorter than the length of the substrate support member 310. It is preferable that horizontal movement speeds of the gas spray part 410 and the suction part 420 are set faster than a movement speed of the substrate support member 310. Alternately, although not shown in the drawings, the gas spray part 410 has a gas nozzle (not shown) on a surface opposite to the gas nozzle 412 to further improve the cleaning efficiency.

Figure 10:
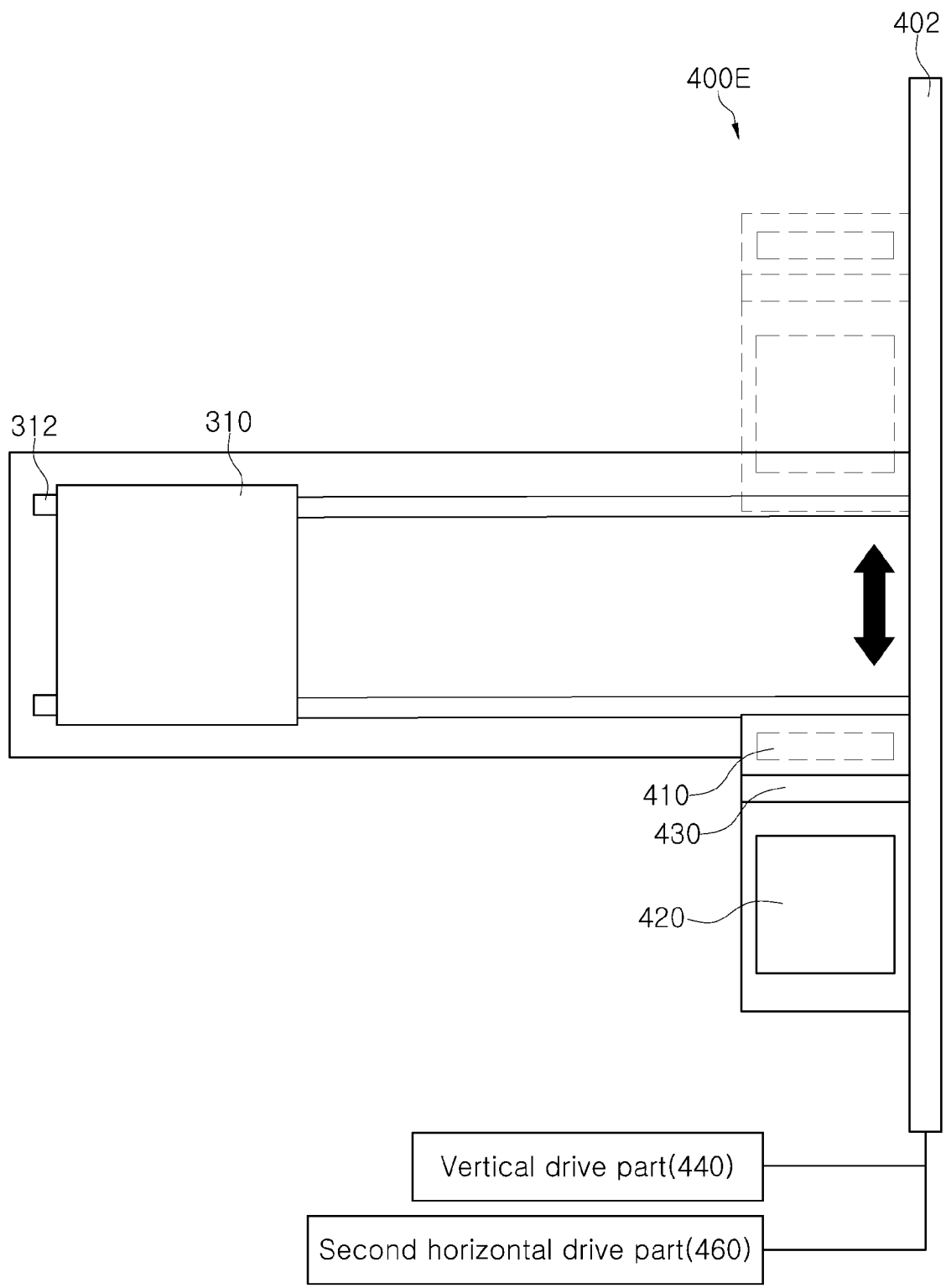
FIG. 10 is an enlarged plan view schematically showing a cleaning unit according to an embodiment of the present disclosure.

FIG. 10 is a top view showing a cleaning unit 400E according to an embodiment of the present disclosure. The cleaning unit 400E according to the embodiment of the present disclosure has the same structure as the cleaning unit 400D as shown in FIG. 9 except for a direction of the gas spray part 410. Therefore, reference numerals are used for the same components and detailed descriptions thereof are omitted.

The gas spray part 410 of the cleaning unit 400E may be arranged at a predetermined angle with respect to a direction perpendicular to a movement direction of the substrate support member 310. The gas spray part 410 may be arranged to spray the gas in the direction perpendicular to the movement direction of the substrate support member 310. Therefore, the gas spray part 410 and the suction part 420 may be supported by the third gantry structure 402.

Figure 11:
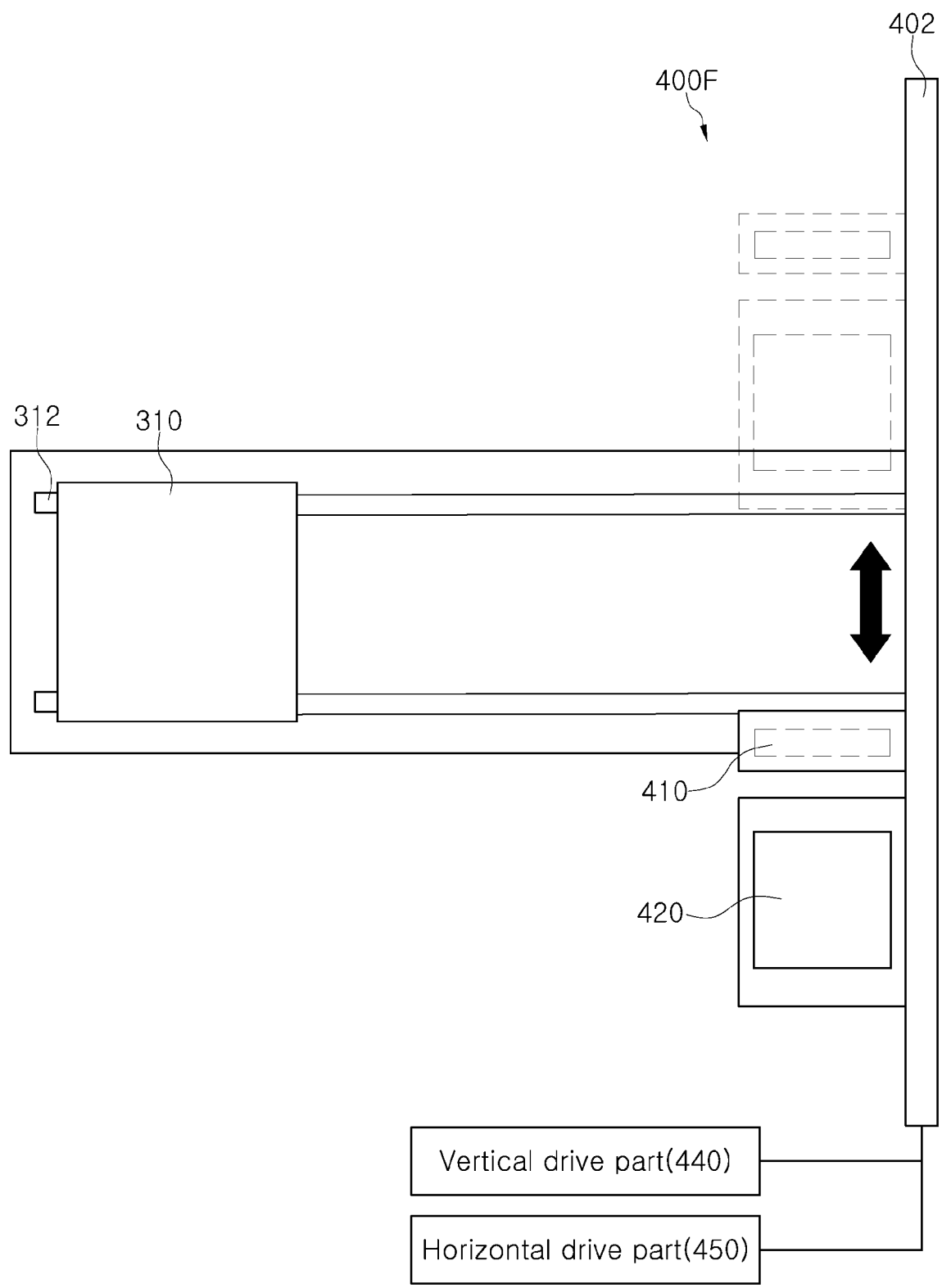
FIG. 11 is an enlarged plan view schematically showing a cleaning unit according to an embodiment of the present disclosure.

FIG. 11 is a top view showing a cleaning unit 400F according to an embodiment of the present disclosure. The cleaning unit 400F according to the embodiment of the present disclosure has the same structure as the cleaning unit 400C as shown in FIG. 8 except that lengths of the gas spray part 410 and the suction part 420 are shortened. Therefore, reference numerals are used for the same components and detailed descriptions thereof are omitted.

The cleaning unit 400F may be configured such that the length of the gas spray part 410 and the suction part 420 separated from each other is shorter than the length of the substrate support member 310. The cleaning unit 400D may include the horizontal drive part 450 provided for horizontally moving the gas spray part 410 and the suction part 420, which are separately provided, along the third gantry structure 402. Therefore, the cleaning unit 400D may be configured to scan the entire upper surface of the substrate support member 310 by being horizontally moved on the upper portion of the substrate support member 310 by the horizontal drive part 450, even when the length of the gas spray part 410 and the suction part 420 are shorter than the length of the substrate support member 310. It is preferable that horizontal movement speeds of the gas spray part 410 and the suction part 420 are set faster than a movement speed of the substrate support member 310. Alternately, although not shown in the drawings, the gas spray part 410 has a gas nozzle (not shown) on a surface opposite to the gas nozzle 412 to further improve the cleaning efficiency.

As described above, the cleaning unit 400 according to the present disclosure may be provided on the upper surface of the substrate support member 310 in various shapes.

As described above, the cleaning process performed by the cleaning unit 400 is performed for the substrate support member 310 before the substrate 20 is loaded, as an example. However, the cleaning unit 400 may serve as a cleaning apparatus performed for various objects such as the substrate 20 loaded on the substrate support member 310 or the substrate 20 on which the bonding process is performed.

In addition, the cleaning unit 400 is held in the X-axis direction by the third gantry structure 402 and the substrate support member 310 are configured to pass through the lower portion of the cleaning unit 400. However, the cleaning unit 400 is configured to be movable in the X-axis direction and to clean the substrate support member 310 in a standby state.

Referring to FIG. 1 again, the bonding equipment 10 may include the inspection module 500 provided for inspecting whether the dies are normally bonded on the substrate 20 after the substrate 20 is unloaded from the bonding module 300. As an example, the inspection module 500 may be connected to the substrate transfer module 200, and the substrate 20 on which the bonding process is complete may be transferred to the inspection module 500 by the substrate transfer module 200.

A substrate alignment unit 600 may be provided inside the inspection module 500. The substrate alignment unit 600 may be used to align the substrate 20 loaded to the inspection module 500.

Hereinabove, although an example of the substrate processing equipment to which the cleaning unit according to the embodiment of the present disclosure is applied has been described with the bonding equipment, the cleaning unit according to the embodiment of the present disclosure may be applied to all types of the substrate processing equipment including the process for removing the contaminants on the substrate.

Although the embodiments of the present disclosure have been disclosed in the detailed description with reference to with the accompanying drawings, it should be understood that the terminology used herein is for the purpose of describing particular embodiments only and is not intended to limit the meaning of elements or to limit the scope and sprit of the present disclosure. Since the present disclosure may be embodied in other specific forms without changing the technical sprit or essential features, those skilled in the art to which the present disclosure belongs should understand that the embodiments described above are exemplary and not intended to limit the present disclosure. The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A cleaning unit comprising:
a gas spray part arranged on an upper surface of a substrate to be cleaned, and configured to spray a gas toward the substrate in order to separate a contaminant on the substrate from the substrate;
a suction part provided on a side of the gas spray part, and comprising an inlet configured to suction and remove the contaminant that is separated from the substrate;
a discharge pump connected to the inlet of the suction part,
wherein the substrate is supported by a substrate support member moving along a pair of transfer rail extending in a first horizontal direction; and
a horizontal drive part configured to move the gas spray part in a second horizontal direction perpendicular to the first horizontal direction.

2. The cleaning unit of claim 1,
wherein the gas spray part is inclined at a predetermined angle with respect to the upper surface of the substrate to spray the gas in an oblique direction toward the upper surface of the substrate.

3. The cleaning unit of claim 2,
wherein the predetermined angle is an acute angle that is equal to or less than 80°.

4. The cleaning unit of claim 1,
wherein the gas spray part comprises a slit type nozzle.

5. The cleaning unit of claim 4,
wherein a slit spacing of the slit type nozzle is equal to or less than 0.3 mm.

6. The cleaning unit of claim 1,
wherein the suction part is arranged to face the upper surface of the substrate to suck the contaminant in a perpendicularly upward direction from the substrate, and
wherein the inlet is provided on a surface of the suction part facing the substrate.

7. The cleaning unit of claim 6,
wherein the suction part comprises a housing with an open lower surface, and
wherein the inlet is provided on an upper surface of the housing.

8. The cleaning unit of claim 3,
wherein the suction part has one lateral wall formed in parallel to the gas spray part, and
wherein the suction part is attached to the gas spray part and is provided integrally with the suction part.

9. The cleaning unit of claim 8,
wherein a middle member is provided between the suction part and the gas spray part.

10. The cleaning unit of claim 1, further comprising:
a vertical drive part configured to vertically move the gas spray part and the suction part.

11. The cleaning unit of claim 8,
wherein the gas spray part and the suction part are physically separated from each other.

12. The cleaning unit of claim 11, wherein the horizontal drive part is configured to further move the suction part in the second horizontal direction.

13. A bonding module comprising:
a substrate support member configured to support a substrate;
a bonding unit comprising at least one bonding head for bonding a die to the substrate; and
a cleaning unit provided on an upper surface of the substrate support member and configured to clean the substrate support member,
wherein the cleaning unit comprises:
a gas spray part configured to spray gas toward the substrate support member in order to separate a contaminant on the substrate support member from the substrate support member; and
a suction part comprising:
an inlet provided on a side of the gas spray part and configured to suction and remove the contaminant separated from the substrate; and
a discharge duct communicating with the inlet to discharge the contaminant.

14. The bonding module of claim 13,
wherein the gas spray part is inclined downward at an acute angle that is equal to or less than 80° with respect to a moving direction of the substrate support member, and
wherein the gas spray part is configured to obliquely spray the gas toward the substrate support member.

15. The bonding module of claim 13,
wherein the gas spray part comprises a slit type nozzle, and
wherein a slit spacing of the slit type nozzle is equal to or less than 0.3 mm.

16. The bonding module of claim 13,
wherein the suction part is arranged to face a transfer rail to suck the contaminant in a perpendicular upward direction of the substrate support member, the suction part including a housing with an open lower surface, and
wherein the inlet is provided at an upper surface of the housing.

17. The bonding module of claim 14,
wherein the suction part has one lateral wall formed in parallel to the gas spray part, and
wherein the one lateral wall is attached to the gas spray part.

18. The bonding module of claim 13, further comprising:
a drive part configured to horizontally and vertically move the cleaning unit.

19. A cleaning unit comprising:
a pair of transfer rails extending in a first horizontal direction, wherein the pair of transfer rails are spaced apart from each other in a second horizontal direction;
a substrate support member supporting a substrate to be cleaned and configured to move along the pair of transfer rails in the first horizontal direction;
a gas spray part disposed above the pair of transfer rails and arranged on an upper surface of the substrate to be cleaned, and configured to spray a gas toward the substrate in order to separate a contaminant on the substrate from the substrate, wherein a first width, in the second horizontal direction, of the gas spray part is greater than a second width, in the second horizontal direction, of the substrate support member;
a suction part provided on a side of the gas spray part, and comprising an inlet configured to suction and remove the contaminant that is separated from the substrate; and
a discharge pump connected to the inlet of the suction part.

20. The cleaning unit of claim 19,
wherein the suction part comprises a housing with an upper surface, a first sidewall extending downwardly from the upper surface, a second sidewall extending downwardly from the upper surface at an acute angle relative to the upper surface of the housing, an open lower surface defined by a lower end of the first sidewall and a lower end of the second sidewall,
wherein the inlet is provided at an upper surface of the housing and connected to the discharge pump, and
wherein the gas spray part is attached to the second sidewall.

* * * * *